US007669090B2

United States Patent
Kitazono et al.

(10) Patent No.: US 7,669,090 B2
(45) Date of Patent: Feb. 23, 2010

(54) APPARATUS AND METHOD FOR VERIFYING CUSTOM IC

(75) Inventors: Hideyuki Kitazono, Tokyo (JP); Toshifumi Sato, Tokyo (JP); Naotaka Oda, Kanagawa-ken (JP); Toshiaki Ito, Kanagawa-ken (JP); Mikio Izumi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 143 days.

(21) Appl. No.: 11/419,051

(22) Filed: May 18, 2006

(65) Prior Publication Data

US 2007/0271489 A1 Nov. 22, 2007

(51) Int. Cl.
- G01R 31/28 (2006.01)
- G11C 29/00 (2006.01)
- G01R 31/26 (2006.01)
- G06F 11/00 (2006.01)

(52) U.S. Cl. .................. 714/703; 714/718; 714/719; 714/724; 714/738; 365/201; 324/765

(58) Field of Classification Search .............. 714/703, 714/718, 719, 724, 738; 365/201; 324/765
See application file for complete search history.

(56) References Cited

U.S. PATENT DOCUMENTS

| 3,257,546 | A | * | 6/1966 | McGovern | 714/703 |
| 3,790,767 | A | * | 2/1974 | Alexander | 702/108 |
| 4,631,724 | A | * | 12/1986 | Shimizu | 714/718 |
| 4,965,799 | A | * | 10/1990 | Green et al. | 714/719 |
| 5,134,612 | A | * | 7/1992 | Yoshimura | 370/545 |
| 5,633,595 | A | * | 5/1997 | Ueda et al. | 324/751 |
| 5,640,539 | A | * | 6/1997 | Goishi et al. | 716/21 |
| 5,659,553 | A | * | 8/1997 | Suzuki | 714/736 |
| 5,796,754 | A | * | 8/1998 | Son | 714/738 |
| 5,919,270 | A | * | 7/1999 | Arkin | 714/736 |
| 6,105,157 | A | * | 8/2000 | Miller | 714/744 |
| 6,195,616 | B1 | * | 2/2001 | Reed et al. | 702/119 |
| 6,195,771 | B1 | * | 2/2001 | Tanabe et al. | 714/718 |
| 6,243,841 | B1 | * | 6/2001 | Mydill | 714/724 |
| 6,457,148 | B1 | * | 9/2002 | Yoshiba | 714/718 |
| 6,559,671 | B2 | * | 5/2003 | Miller et al. | 324/765 |
| 6,658,606 | B1 | * | 12/2003 | Link et al. | 714/703 |
| 6,708,139 | B2 | * | 3/2004 | Rearick et al. | 702/185 |

(Continued)

FOREIGN PATENT DOCUMENTS

JP 3-209849 9/1991

*Primary Examiner*—Kevin L Ellis
*Assistant Examiner*—Guerrier Merant
(74) *Attorney, Agent, or Firm*—Oblon, Spivak, McClelland, Maier & Neustadt, L.L.P.

(57) ABSTRACT

An apparatus for verifying a custom IC including a test pattern generating unit for generating a test pattern for verifying a function of the custom IC. The test pattern is output to a master IC and a test IC. The apparatus further includes a comparing unit connected to receive operation signals output from the master IC and the test IC for comparing the operation signals to see if the operation signals are agreed with each other and for generating a comparison signal based on a comparison result, a judging unit connected to receive the comparison signal for judging if there is any abnormality in the test IC and for outputting a judged signal based on a judged result, and a computer connected to receive the judged signal for displaying the judged result of the test IC.

11 Claims, 3 Drawing Sheets

U.S. PATENT DOCUMENTS

| | | | |
|---|---|---|---|
| 6,778,783 B2 * | 8/2004 | Okayasu et al. | 398/182 |
| 6,865,698 B2 * | 3/2005 | Housako | 714/700 |
| 6,934,884 B1 * | 8/2005 | Wakabayashi et al. | 714/30 |
| 7,290,188 B1 * | 10/2007 | Peterson et al. | 714/724 |
| 2001/0013110 A1 * | 8/2001 | Pierce et al. | 714/718 |
| 2002/0099993 A1 * | 7/2002 | Ikeda | 714/738 |
| 2002/0107670 A1 * | 8/2002 | Sugai | 702/189 |
| 2005/0149804 A1 * | 7/2005 | Hiraide | 714/738 |
| 2005/0216808 A1 * | 9/2005 | Poechmueller | 714/738 |
| 2005/0289419 A1 * | 12/2005 | Okano et al. | 714/726 |
| 2006/0239055 A1 * | 10/2006 | Sonoda et al. | 365/51 |
| 2007/0035289 A1 * | 2/2007 | Washizu | 324/76.77 |
| 2008/0120059 A1 * | 5/2008 | Awaji et al. | 702/125 |

* cited by examiner

APPARATUS AND METHOD FOR VERIFYING CUSTOM IC

BACKGROUND OF THE INVENTION

1. Field of the Invention

This invention relates to an apparatus and a method for verifying a custom IC (Integrated circuit), and more particularly to an apparatus and a method for verifying functions of a custom IC used in a safety protection system and so on of a nuclear power generation facility.

2. Description of the Background

In recent years, applications of semiconductor integrated circuits are extending in various fields, and at the same time, demands for each application field are also expanding variously. In apparatuses provided in safety protection systems of nuclear power generating facilities, such custom ICs as PLD (Programmable Logic Device), FPGA (Field Programmable Gate Array), and ASIC (Application Specific Integrated Circuit) are used. A high reliability is demanded for these custom ICs, and for its verification, the simulation using a software and the functional test with custom ICs mounted are so far conducted (Patent Document 1).

[Patent Document 1] Japanese Patent Disclosure (Kokai) No. Hei 3-209849

The method for verifying a custom IC so far available as described above has problems that a long time is required for the verification test for the custom IC and the verification efficiency is poor for the custom IC as a circuit component.

SUMMARY OF THE INVENTION

This invention is made in order to solve the problems described above, and an object of this invention is to provide an apparatus and a method for verifying a custom IC capable of verifying the functions of a custom IC accurately and efficiently.

According to an aspect of this invention, there is provided an apparatus for verifying a custom IC including a test pattern generating unit for generating a test pattern for verifying a function of the custom IC. The test pattern is output to a master IC and a test IC. The apparatus further includes a comparing unit connected to receive operation signals output from the master IC and the test IC for comparing the operation signals to see if the operation signals are agreed with each other and for generating a comparison signal based on a comparison result, a judging unit connected to receive the comparison signal for judging if there is any abnormality in the test IC and for outputting a judged signal based on a judged result, and a computer connected to receive the judged signal for displaying the judged result of the test IC.

According to another aspect of this invention, there is provided an apparatus for verifying a custom IC including a start switch for generating a verification test start signal to control verification test of the custom IC, a stop switch for stopping the verification test of the custom IC in the middle, a test pattern generating unit connected to receive the verification test start signal for generating a test pattern for verifying a function of the custom IC based on the verification test start signal, a data display unit connected to receive the test pattern for displaying data of the test pattern. The test pattern is output to a master IC and a test IC. The apparatus further includes a comparing unit connected to receive operation signals output from the master IC and the test IC for comparing the operation signals to see if the operation signals are agreed with each other and for generating a comparison signal based on a comparison result, a judging unit connected to receive the comparison signal for judging if there is any abnormality in the test IC and for outputting a judged signal based on a judged result, and a display unit connected to receive the judged signal for displaying the judged result of the test IC. The comparing unit holds the operation signals in synchronism with a change of the test pattern.

According to still another aspect of this invention, there is provided a method for verifying a custom IC including generating a test pattern for verifying a function of the custom IC, inputting the test pattern to a master IC and a test IC, comparing operation signals output from the master IC and the test IC to see if the operation signals are agreed with each other, and judging if there is any abnormality in the test IC based on a comparison result.

According to this invention, the functions of a custom IC can be verified accurately and efficiently.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
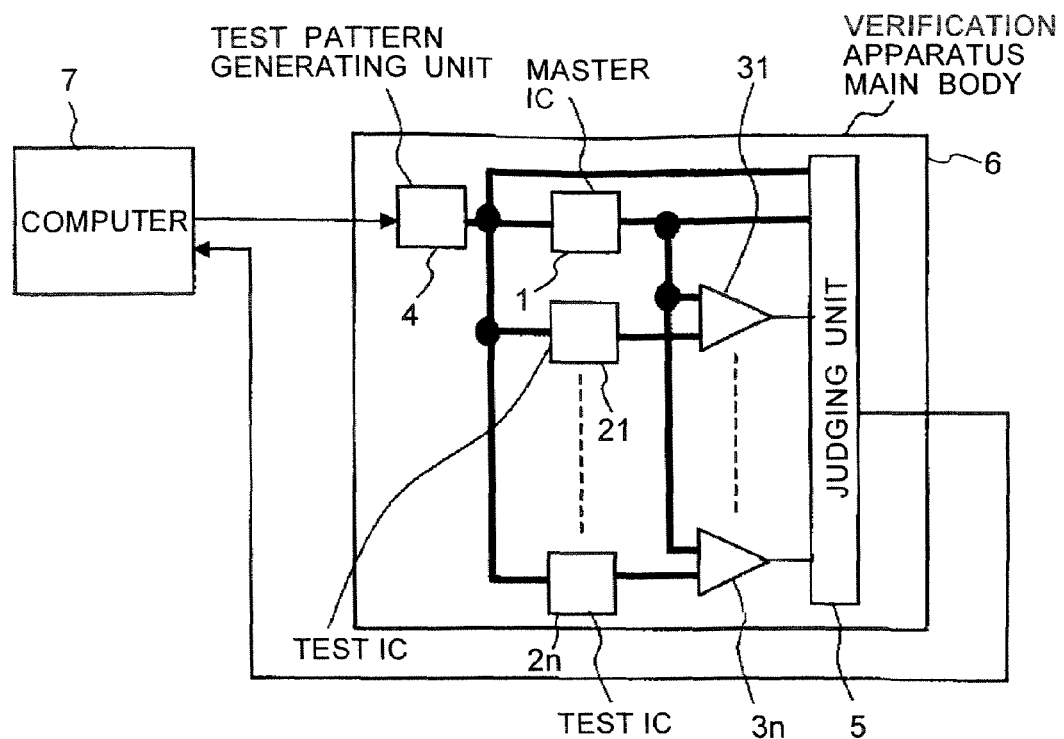
FIG. 1 is a block diagram showing the construction of an apparatus for verifying a custom IC according to a first embodiment of this invention.

Referring now to the drawings, wherein like reference numerals designate identical or corresponding parts throughout the several views, the embodiments of this invention will be described below.

First Embodiment

An apparatus for verifying a custom IC according to this embodiment is composed of a computer 7 and a verification apparatus main body 6, as shown in FIG. 1. Verification apparatus main body 6 is composed of a test pattern generating unit 4, a plurality of comparing units 31~3$n$ and a judging unit 5. Test pattern generating unit 4 generates a test pattern for verifying the functions of ICs 21~2$n$ to be tested (hereinafter referred to simply as "test IC") which are the objects for the verification. Test pattern generating unit 4 outputs the test pattern as an input signal to test ICs 21~2$n$ and a master IC 1 in the same kind and rating as those of test ICs 21~2$n$. Each of comparing units 31~3$n$ receives a signal output from master IC 1 and one of signals output from test ICs 21~2$n$, and compares to judge whether the two received signals are agreed or not, respectively. Judging unit 5 receives signals output from the comparing units 31~3$n$ and judges if there is any abnormality in test ICs 21~2$n$. Computer 7 inputs these verification test conditions and displays the test result judged by judging unit 5. Further, master IC 1 and test ICs 21~2n are detachable.

In the apparatus for verifying a custom IC in the structure as described above, a verification test starting command is output from computer 7 to test pattern generating unit 4. Then test pattern generating unit 4 generates the test pattern, such that bit patterns of the test patterns are incremented from "0", are changed to random bit patterns, or are changed to specific bit patterns at the actual operating speed of test IC 21~2n, and outputs the test pattern thus generated to master IC 1 and test ICs 21~2n simultaneously. Each of master IC 1 and test ICs 21~2n receives the signal from the test pattern generating unit 4 and outputs a signal after processed in the IC itself. Each of comparing unit 31~3n receives the signal output from master IC 1 and one of the signals output from test ICs 21~2n and compares to see if two received signals are agreed with each other, respectively. Judging unit 5 judges as to whether there is any abnormality in test ICs 21~2n by the signals output from comparing units 31~3n. In judging unit 5, the operation is executed faster than the operating speed of the test pattern. Computer 7 reads the judged result of the judging unit 5 as appropriate and displays the good or no good of test ICs 21~2n.

Further, in order to check whether there is an abnormality in the test pattern generating unit 4, the output signal from test pattern generating unit 4 is input into judging unit 5 and its data is read into computer 7 from judging unit 5. Computer 7 judges whether there is an abnormality in the test pattern output from test pattern generating unit 4 and the judged result is displayed. Further, in order to check whether there is an abnormality in master IC 1, the test patterns are varied in test pattern generating unit 4 and are output to master IC 1. After processed in master IC 1, a signal is output to judging unit 5. Computer 7 compares the output of judging unit 5 with a signal to be output from master IC 1, judges whether there is an abnormality in master IC 1, and then displays the judged result.

According to this embodiment, as a plurality of test ICs 21~2n are operated at the actual operating speed, it is possible to verify the operations of a plurality of ICs in the actual using state simultaneously, and further as the operating speed of judging unit 5 is faster than the varying speed of the test patterns, the timing can be verified. Further, the apparatus for verifying a custom IC itself also can be verified.

Second Embodiment

Figure 2:
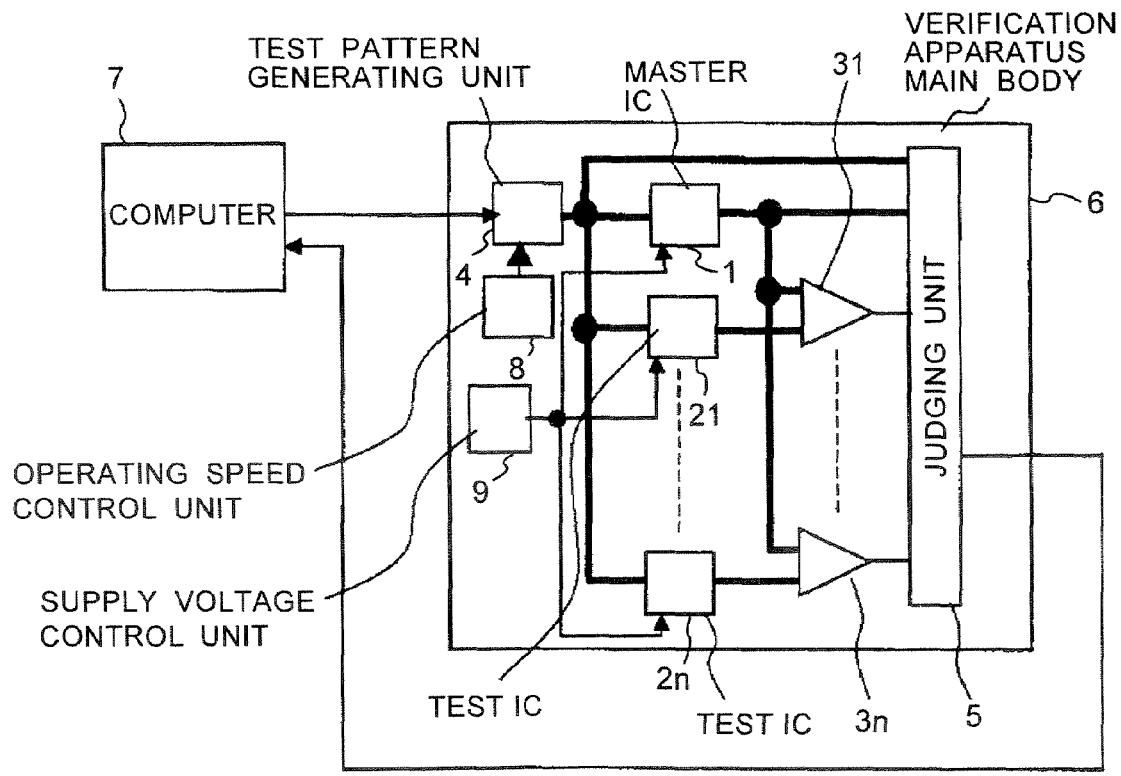
FIG. 2 is a block diagram showing the construction of an apparatus for verifying a custom IC according to a second embodiment of this invention.

Next, a second embodiment of an apparatus for verifying a custom IC of this invention will be explained referring to FIG. 2. Further, the same component elements as those in the first embodiment will be assigned with the same reference numerals and the duplicated explanation will be omitted.

The apparatus for verifying a custom IC in this embodiment is, in addition to the first embodiment, further provided with an operating speed control unit 8 to vary a changing speed of the signal (test pattern) generated in test pattern generating unit 4 and a supply voltage control unit 9 to vary supply voltages supplied to master IC 1 and test ICs 21~2n.

In the apparatus for verifying a custom IC in the structure describe above in this embodiment, the changing speed of the test pattern generated in test pattern generating unit 4 is accelerated or decelerated according to a signal from operating speed control unit 8. Further, supply voltages of master IC 1 and test ICs 21~2n are changed by supply voltage control unit 9.

According to this embodiment, test ICs 21~2n can be operated at various operating speeds, and therefore the tolerance of the operating speed of test ICs 21~2n can be verified. Further, as master IC 1 and test ICs 21~2n can be operated by varying the supply voltages thereof by supply voltage control unit 9, it is possible to verify the tolerance of supply voltage.

Third Embodiment

Figure 3:
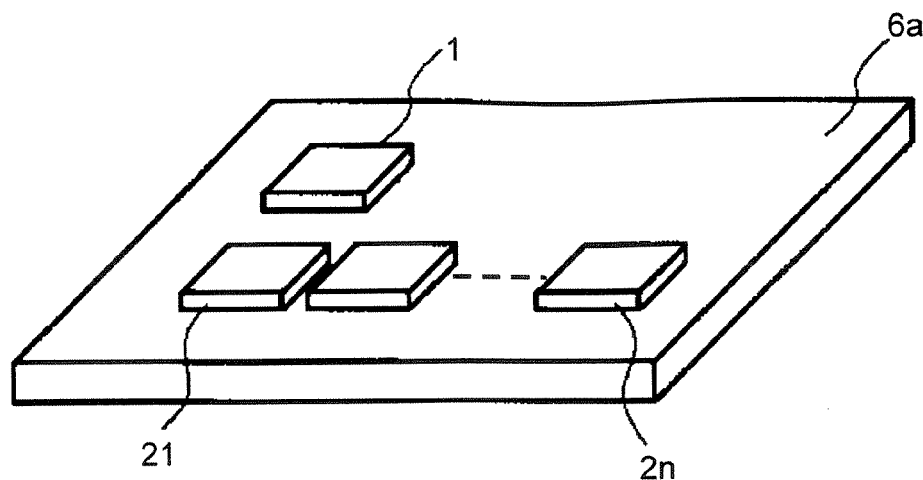
FIG. 3 is a perspective view showing the main part of the construction of an apparatus for verifying a custom IC according to a third embodiment of this invention.

Next, a third embodiment of an apparatus for verifying a custom IC of this invention will be explained referring to FIG. 3. Further, the same component elements as those in the first embodiment or the second embodiment will be assigned with the same reference numerals and the duplicated explanation will be omitted. In this embodiment, master IC 1 and test ICs 21~2n are mounted on the same one surface of a circuit board 6a.

According to this embodiment, as master IC 1 and test ICs 21~2n are mounted on the same surface of circuit board 6a, when circuit board 6a is put in a constant temperature oven and the temperature/humidity tests are conducted, the environmental conditions of master IC 1 and test ICs 21~2n become the same as the temperature/humidity of the constant temperature oven, and therefore it becomes possible to conduct the environmental test of test ICs itself.

In the first through third embodiments described above, a plurality of test ICs 21~2n are simultaneously tested. But this invention is not limited to these embodiments. According to this invention, it is possible to execute the verification for test only one test IC in one time.

Fourth Embodiment

Figure 4:
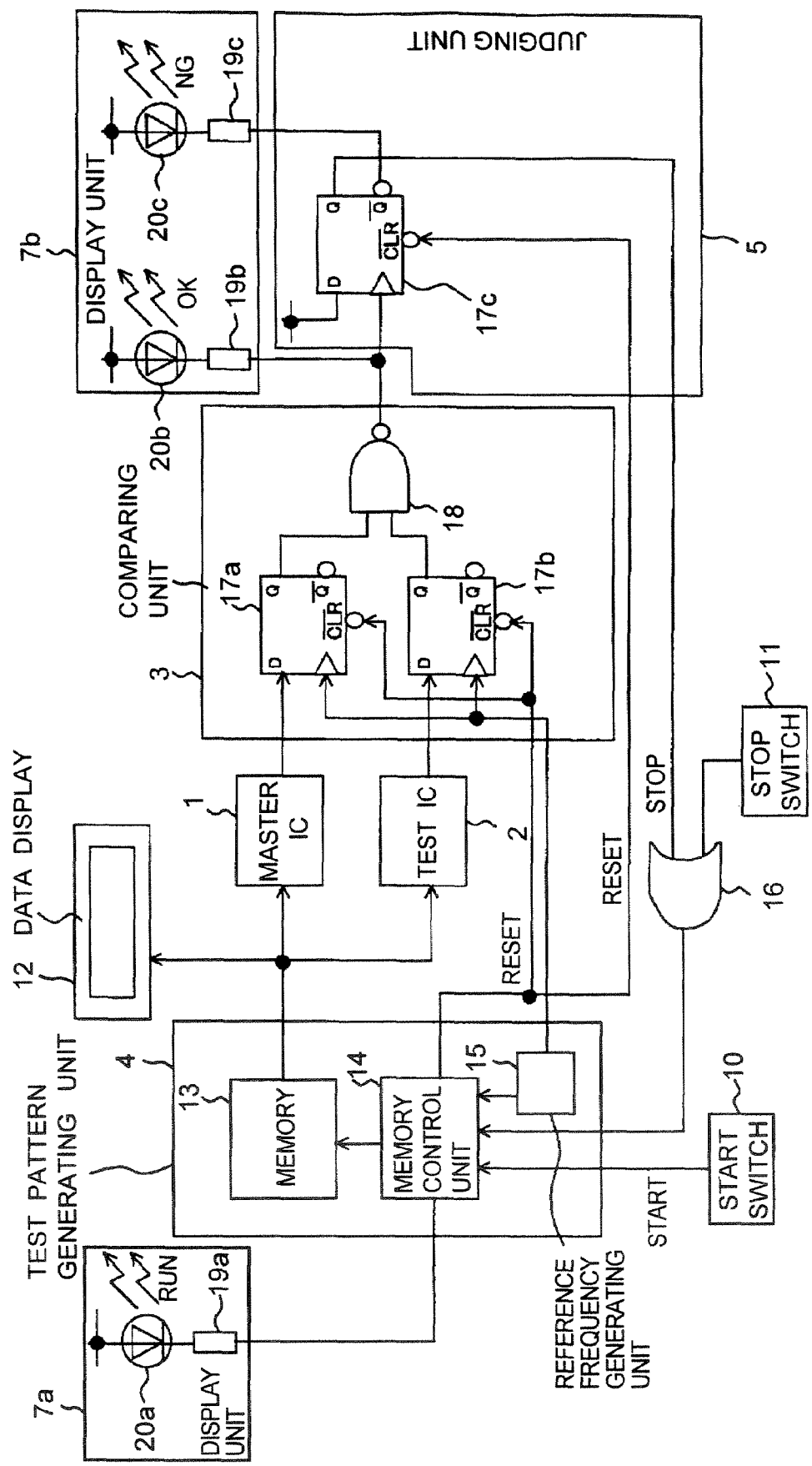
FIG. 4 is a block diagram showing the construction of an apparatus for verifying a custom IC according to a fourth embodiment of this invention.

Next, a fourth embodiment of an apparatus for verifying a custom IC of this invention will be explained referring to FIG. 4 and FIG. 5. Further, the same component elements as those in the fourth embodiment will be assigned with the same reference numerals and the duplicate explanation is omitted.

This embodiment is in the structure without using computer 7 in the first and second embodiments. This embodiment is provided with test pattern generating unit 4, comparing unit 3 and judging unit 5. In addition, this embodiment is provided with a start switch 10 to output a test verification starting command START, a stop switch 11 that is capable of finishing the verification test in its middle, a data display unit 12 to display the data of the test pattern, an OR circuit 16 to take a logical sum of a stop signal STOP from the judging unit 5 and a signal from stop switch 11 and display units 7a and 7b. Here, test pattern generating unit 4 is provided with a memory 13, a memory control unit 14 and a reference frequency generating unit 15. Comparing unit 3 is provided with D latches 17a, 17b and a NAND circuit 18. Judging unit 5 is provided with a D latch 17c. Display unit 7a is provided with a current limiting circuit 19a and a LED display unit 20a. Display unit 7b is provided with current limiting circuits 19b and 19c and LED display units 20b and 20c.

Figure 5:
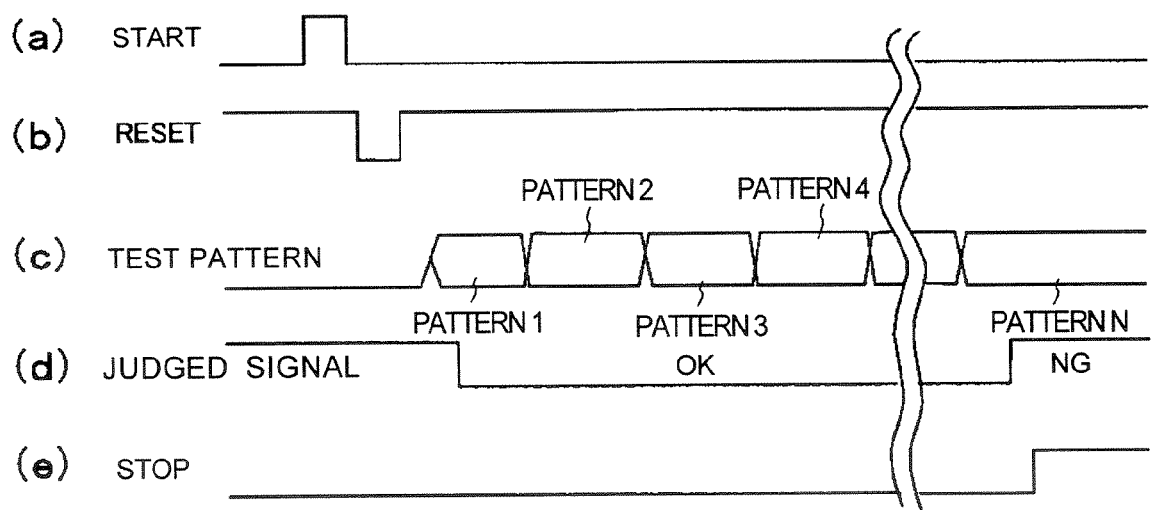
FIG. 5 is a timing chart showing the operation of the apparatus for verifying a custom IC according to the fourth embodiment of this invention.

In the apparatus for verifying custom IC in the structure as described above in this embodiment, when a verification test starting command START is output from start switch 10 (FIG. 5(a)), a reset signal RESET is output from memory control unit 14 in test pattern generating unit 4 to $\overline{\text{CLR}}$ terminals of D latches 17a and 17b in comparing unit 3 and a $\overline{\text{CLR}}$ terminal of D latch 17c in judging unit 5 (FIG. 5(b)) so that the D latches 17a, 17b and 17c are initialized. Further, an in-process signal is output from memory control unit 14 to display unit 7a, and "RUN" is displayed on LED display unit 20a through current limiting circuit 19a in display unit 7a. Further, memory control unit 14 changes an address signal for memory 13 at a timing given from reference frequency generating unit 15, and memory 13 outputs a test pattern at that timing (FIG. 5(*c*)). This test pattern is composed of, for example, a pattern 1, a pattern 2, a pattern 3, a pattern 4 to pattern N as shown in FIG. 5(*c*), and is output to master IC 1 and test IC 2. This test pattern is displayed on data display 12.

When master IC 1 and test IC 2 receive the test pattern from memory 13, they output signals, after the processing in ICs, to D terminals of D latches 17*a* and 17*b* in comparing unit 3, respectively. In comparing unit 3, the output signals from master IC 1 and test IC 2 are held by D latches 17*a*, 17*b* at the timing of the signal from reference frequency generating unit 15, respectively. The signals output from Q terminals of D latches 17*a* and 17*b* are input to NAND circuit 18. In NAND circuit 18, the signal output from master IC 1 is compared with the signal output from test IC 2 to check if both signals are in accord with, and a comparison signal is output to D latch 17*c* in judging unit 5 based on the comparison result. Judging unit 5 receives the comparison signal and judges whether there is an abnormality in test IC 2 according to the comparison signal output from comparing unit 3.

The comparison signal is also output to display unit 7*b*. When test IC 2 is normal, "OK" is displayed on LED display 20*b* through current limiting circuit 19*b* in display unit 7*b* (FIG. 5(*d*)). The signal from $\overline{Q}$ terminal of latch 17*c* in judging unit 5 is output to display unit 7*b*. When test IC 2 is abnormal, "NG" is displayed on LED display 20*c* through current limiting circuit 19*c* in display unit 7*b* (FIG. 5(*d*)). Further, D latch 17*c* outputs stop signal STOP from a Q terminal to OR circuit (FIG. 5(*e*)). OR circuit 16 outputs a signal to test pattern generating unit 4 according to this stop signal STOP so as to stop the verification test. When "NG" is displayed on LED display 20*c*, test IC 2 is judged to be no good.

According to this embodiment, the output signal of master IC 1 and the output signal of test IC 2 can be held synchronously with the change of test pattern, and therefore, it is possible to absorb a timing difference of the above output signals, and thereby the erroneous judgment of abnormal test IC 2 can be prevented. Further, it is possible to detect in which test pattern IC is judged abnormal, without using a computer.

In the fourth embodiment described above, only one test IC 2 is tested. But this invention is not limited to this embodiment. According to this invention, it is possible to execute the verification test for a plurality of test ICs simultaneously by modifying the construction of comparing unit 3.

Obviously, numerous modifications and variations of the present invention are possible in light of the above teachings. It is therefore to be understood that within the scope of the appended claims, the invention may be practiced otherwise than as specifically described herein.

What is claimed is:

1. An apparatus for verifying a test IC, comprising:
   a computer configured to generate a verification test start command;
   a test pattern generating unit connected to receive said verification test start command for generating a test pattern for verifying a function of said test IC, said test pattern being output to a master IC and the test IC;
   a comparing unit connected to receive operation signals output from said master IC and said test IC for comparing said operation signals to see if said operation signals are agreed with each other and for generating a comparison signal based on a comparison result; and
   a judging unit connected to receive said comparison signal for judging if there is any abnormality in said test IC and for outputting a judged signal based on a judged result, said computer being connected to receive said judged signal for displaying said judged result of said test IC and being configured to judge and display whether or not there is an abnormality in said apparatus for verifying said test IC,
   wherein said test pattern is further input to said judging unit from said test pattern generating unit without being input to said master IC or said test IC, and said computer stores an expected test pattern which is expected to be generated in said test pattern generating unit, said judging unit outputs said test pattern to said computer and said computer compares said test pattern to said expected test pattern, and said computer displays whether or not there is an abnormality in said test pattern generating unit based on a comparison result so as to verify said apparatus itself, and
   wherein said operation signal from said master IC is input to said judging unit, and said computer stores an expected operation signal which is expected to be generated from said master IC, said computer is connected to receive said operation signal from said master IC output from said judging unit and compares said operation signal to said expected operation signal, and said computer displays whether or not there is an abnormality in said master IC based on a comparison result so as to verify said apparatus itself.

2. The apparatus for verifying a test IC according to claim 1, wherein:
   said test pattern generating unit varies said test pattern at an actual operating speed of said test IC and generates said test pattern to said master IC and said test IC.

3. The apparatus for verifying a test IC according to claim 1, wherein:
   said judging unit operates faster than an operation speed of said test pattern so as to verify a timing.

4. The apparatus for verifying a test IC according to claim 1, further comprising:
   an operating speed control unit for varying a changing speed of said test pattern generated in said test pattern generating unit.

5. The apparatus for verifying a test IC according to claim 1, further comprising:
   a supply voltage control unit for varying supply voltages of said master IC and said test IC.

6. The apparatus for verifying a test IC according to claim 1, wherein:
   said master IC and said test IC are mounted on a same surface of a circuit board.

7. The apparatus for verifying a test IC according to claim 1, wherein:
   a plurality of test ICs are verified.

8. An apparatus for verifying a test IC, comprising:
   a start switch for generating a verification test start signal to control verification test of said test IC;
   a stop switch for stopping said verification test of said test IC in the middle;
   a test pattern generating unit connected to receive said verification test start signal for generating a test pattern for verifying a function of said test IC based on said verification test start signal;
   a data display unit connected to receive said test pattern for displaying data of said test pattern, said test pattern being output to a master IC and the test IC;
   a comparing unit connected to receive operation signals output from said master IC and said test IC for comparing said operation signals to see if said operation signals are agreed with each other and for generating a comparison signal based on a comparison result;

a judging unit connected to receive said comparison signal for judging if there is any abnormality in said test IC and for outputting a judged signal based on a judged result; and a display unit connected to receive said judged signal for displaying said judged result of said test IC, wherein said comparing unit is configured to hold said operation signals in synchronism with a change of said test pattern, and to absorb a timing difference between said operation signals output from said master IC and said test IC.

9. The apparatus for verifying a test IC according to claim 8, wherein:

a plurality of test ICs are verified.

10. A method for verifying a test IC using an apparatus for verifying said test IC having a computer, the method comprising:

generating a verification test start command from said computer;

generating a test pattern for verifying a function of said test IC based on said verification test start command from said computer;

inputting said test pattern to a master IC and said test IC;

comparing operation signals output from said master IC and said test IC to see if said operation signals are agreed with each other;

judging if there is any abnormality in said test IC and outputting a judged signal based on a comparison result; and displaying a judged result based on said judged signal by said computer and judging and displaying whether or not there is an abnormality in said apparatus for verifying said test IC.

11. The method for verifying a test IC according to claim 10, wherein:

a plurality of test ICs are verified.

* * * * *